United States Patent [19]

Reylek et al.

[11] Patent Number: 4,606,962
[45] Date of Patent: Aug. 19, 1986

[54] ELECTRICALLY AND THERMALLY CONDUCTIVE ADHESIVE TRANSFER TAPE

[75] Inventors: Robert S. Reylek, Shoreview; Kenneth C. Thompson, Cottage Grove, both of Minn.

[73] Assignee: Minnesota Mining and Manufacturing Company, St. Paul, Minn.

[21] Appl. No.: 739,508

[22] Filed: May 31, 1985

Related U.S. Application Data

[63] Continuation of Ser. No. 503,578, Jun. 13, 1983, abandoned.

[51] Int. Cl.$^4$ .............................................. B32B 5/00
[52] U.S. Cl. ..................................... 428/148; 156/250; 156/272.2; 428/156; 428/172; 428/200; 428/206; 428/213; 428/323; 428/328; 428/343; 428/349; 428/355
[58] Field of Search ............... 428/148, 156, 172, 200, 428/206, 213, 323, 328, 343, 349, 355; 156/250, 272.2

[56] References Cited

U.S. PATENT DOCUMENTS

| | | | |
|---|---|---|---|
| 2,748,701 | 6/1956 | Barrows | 428/148 |
| 2,925,174 | 2/1960 | Stow | 428/346 |
| 2,964,587 | 12/1960 | Minot | 428/138 |
| 3,132,204 | 5/1964 | Giellerup | 174/117 R |
| 3,311,696 | 3/1967 | Melnick | 428/139 |
| 3,475,213 | 10/1969 | Stow | 428/344 |
| 3,497,383 | 2/1970 | Olyphant, Jr. et al. | 428/209 |
| 3,514,326 | 5/1970 | Stow | 428/343 |
| 4,113,981 | 9/1978 | Fujita et al. | 174/94 R |

Primary Examiner—George F. Lesmes
Assistant Examiner—William M. Atkinson
Attorney, Agent, or Firm—Donald M. Sell; James A. Smith; Gerald F. Chernivec

[57] ABSTRACT

The adhesive layer of the novel transfer tape contains electrically and thermally conductive particles such as silver which are preferably spherical and are larger than the thickness of the adhesive between particles. When used to bond two rigid substrates together, pressure is applied to the substrates to flatten the particles to the thickness of the adhesive between particles, thus making good electrical and thermal connection between the substrates through each particle.

24 Claims, 5 Drawing Figures

U.S. Patent  Aug. 19, 1986  Sheet 1 of 2  4,606,962
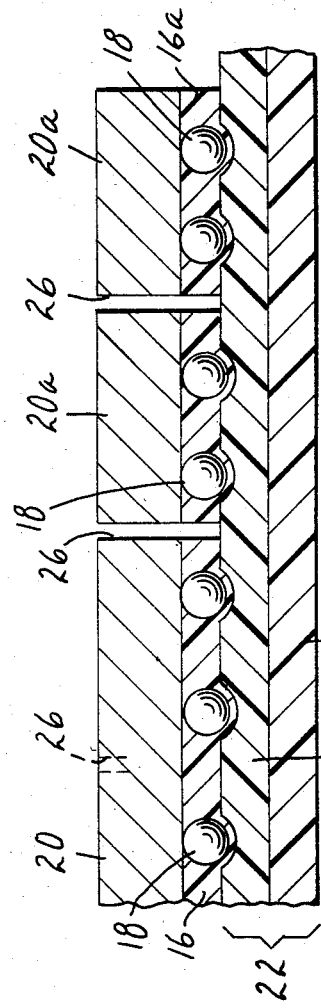
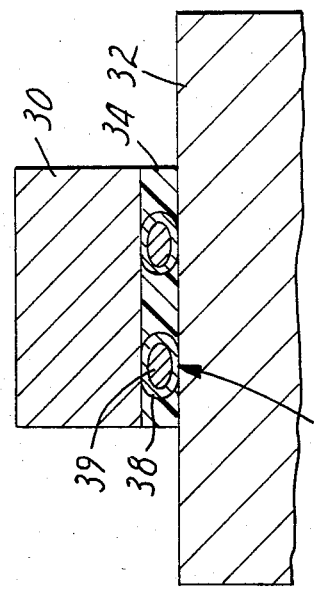
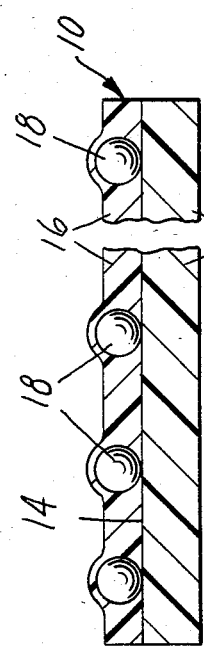

ELECTRICALLY AND THERMALLY CONDUCTIVE ADHESIVE TRANSFER TAPE

This is a continuation of application Ser. No. 503,578, filed June 13, 1983, now abandoned.

FIELD OF THE INVENTION

The invention concerns an adhesive transfer tape which makes electrically and thermally conductive bonds such as are desirable for attaching a semiconductor die or chip to an electrically and thermally conductive substrate, a use previously served primarily by spreadable adhesives or by strips of solder or eutectic alloy.

BACKGROUND ART

Semiconductors such as integrated circuits are formed on wafers which are then cut into dice or chips that individually may be mounted onto substrates. Usually the substrate is electrically and thermally conductive, and mounting provides both good electrical and good thermal conductivity between the die and the substrate. Good thermal conductivity permits the substrate to serve as a heat sink for the die. An effective heat sink is desirable, because as a rule of thumb, an increase of 10° C. in the operating temperature of a semiconductor die reduces its life by one-half. Generally the attainment of good thermal conductivity is inherently accompanied by adequate electrical conductivity.

Of the two prevalent techniques for attaching a semiconductor die to an electrically and thermally conductive substrate, one employs a solder or eutectic alloy such as a gold-silicon alloy. While such alloys provide excellent electrical and thermal conductivity, they are exceedingly expensive. Also, their application temperatures may be so high that some dice might be damaged, and differences in thermal expansion sometimes cause a die to break. Furthermore, it is difficult to handle an individual die together with an alloy strip of the same size.

Because of the expense and difficulties in using eutectic alloys, it has become more common to employ a spreadable die attach adhesive consisting of a heat-curing epoxy resin composition filled with fine metal particles, usually silver and occasionally gold. Spreadable epoxy adhesives can be difficult to use, especially those which are marketed in two parts and must be thoroughly mixed shortly before use. Care must be taken to keep the metal particles in suspension, to spread out a uniform layer of the proper thickness, and not to allow voids in the adhesive layer. Automated attachment of dice to substrates is complicated by the waiting period during which the epoxy composition is cured.

DISCLOSURE OF THE INVENTION

The above-discussed difficulties of prior die attach systems are avoided in the present invention by an electrically and thermally conductive adhesive transfer tape which is easy to use and reliably attaches individual semiconductor dice to conductive substrates. As compared to metal-filled epoxy compositions, the novel adhesive transfer tape should be of comparable cost.

Briefly, the adhesive transfer tape of the invention comprises a flexible, low-adhesion carrier web to which is lightly adhered a layer of adhesive containing electrically and thermally conductive particles which at the bonding temperature of the adhesive are at least as deformable as are substantially pure silver spherical particles at ordinary room temperature. The particles should be of uniform thickness. By "uniform" is meant that substantially all of the particles (disregarding fines, which are too difficult to eliminate) differ in diameters by no more than 2 to 1. The average thickness of the particles is greater than the thickness of the adhesive between particles, preferably from 10 to 100% greater. The particles are uniformly distributed throughout the layer or throughout preselected segments of the layer. When the particle-containing adhesive layer is removed from the carrier web and compressed between two flat, rigid plates, the particles are flattened to the thickness of the adhesive between particles. This provides small, flat conductive areas at both surfaces of the adhesive layer sufficient to provide good electrical and thermal contact between a die and a conductive substrate through each of the flattened particles.

While being primarily useful as a die attach adhesive tape, the novel transfer tape can be used wherever it is desired to make an electrically conductive bond between two rigid, uniformly spaced surfaces. Although such uses may not require good thermal conductivity, this inherently is achieved due to the direct contact of each of the electrically and thermally conductive particles to each of the surfaces which are being bonded together. In one such use, the novel tape can be used for surface-mounted components of a printed circuit board. For example, a chip carrier having a plurality of conductive pads can be bonded by the novel transfer tape to connect each pad individually to a conductor in the printed circuit board. The adhesive layer of the novel tape provides good electrical conductivity through its thickness and good electrical insulation laterally, especially when the particles occupy less than 40% by volume of the adhesive layer.

To economize the use of the electrically conductive particles, they may be located only in segments of the novel adhesive transfer tape which are to contact individual electrical conductors. This can be accomplished by the steps of:

(1) coating onto a flexible, low-adhesion carrier web a viscous monomer composition which is radiation-polymerizable to an adhesive state, (2) selectively exposing the coating to radiation to polymerize segments of the monomer composition to a substantially tack-free adhesive state, (3) applying electrically conductive particles to the coating to become adhered only to the viscous monomer composition, and (4) again exposing the coating to radiation to polymerize the balance of the coating to a substantially tack-free adhesive state.

Because the viscosity of a mixture of polymerizable monomers may be too low to provide desirably thin coatings, the monomers may be partially polymerized to provide a sufficiently viscous monomer composition, e.g., having a coatable viscosity within the range of 1000 to 40,000 cps.

A second technique for locating electrically conductive particles only in preselected segments of the adhesive layer involves the steps of:

(1) coating onto a flexible, low-adhesion carrier web a viscous monomer composition which is radiation-polymerizable to an adhesive state and contains electrically conductive particles, (2) selectively exposing the coating to radiation to polymerize segments of the monomer composition to a solvent-resistant adhesive state, (3) dissolving or otherwise removing portions of the coating between the polymerized adhesive segments, and (4) overcoating the entire segment-containing face of the carrier web with an adhesive such that the total thickness of both adhesive layers between particles is less than the average thickness of the particles.

The adhesive applied in step (4) can be applied from solution or as a radiation-polymerizable monomer composition.

A third technique is similar to the second except that instead of steps (1) and (2), an adhesive is applied from solution only onto preselected segments of the low-adhesion carrier, e.g., by silk screening.

Preferably the adhesive of the novel transfer tape is heat-activatable, i.e., a thermosetting, hot-melt or hot-tackifying adhesive. Such adhesives usually are non-tacky at ordinary room temperatures and, upon being activated by heat, flow sufficiently under pressure such that the faces of the small, flat conductive areas created at the surfaces of the adhesive layer should be free from adhesive.

When the novel transfer tape has a heat-activatable adhesive, its low-adhesion carrier web preferably has sufficient resistance to heat to permit the adhesive to be heat-activated while being supported by the carrier web. Particularly useful carrier webs are polytetrafluoroethylene and polyimide films, both of which have good heat resistance, strength, dimensional stability, and age resistance. Also useful are biaxially-oriented polyethylene terephthalate, aromatic polyimide ("Kevlar"), and polyvinyl fluoride ("Tedlar") films.

The adhesive layer of the novel adhesive transfer tape preferably is a polymer of alkyl acrylate and/or methacrylate having an average of 1–12 carbon atoms in the alkyl groups. Such a polymer provides better adhesion when it is a copolymer of monomers, up to 50 mol % of which is at least one copolymerizable monomer selected from acrylic acid, methacrylic acid, itaconic acid, maleic acid, maleic anhydride, amides of said acids, and N-vinyl-2-pyrrolidone. The acids should be minimized or avoided when electrical connections are to be made where corrosion might be a problem. Polymers based on alkyl acrylates having an average of 4–12 carbon atoms in their alkyl groups are pressure-sensitive adhesives and may have a weight-averaged $T_g$ in the range from $-20°$ to $-70°$ C. When the average is 1–3 or when a polymer is based on an alkyl methacrylate, the copolymer may have a weight-averaged $T_g$ in the range from $-10°$ to $-80°$ C. and be nontacky or poorly tacky at ordinary room temperatures, but become aggressively tacky when heated. An adhesive which is nontacky at ordinary room temperatures better holds electrically-conductive particles in place after the novel tape has been applied to make electrical connections. Hence, those electrical connections tend to be more secure and more resistant to brief exposure to soldering temperatures. Where such exposure is contemplated, a weight-averaged $T_g$ of from 30° to 80° C. is preferred. However, much the same result can be attained by crosslinking a polymer of lower $T_g$ after the electrical connections have been made, e.g., as taught in U.S. Pat. No. 2,925,174.

The particles of the novel tape preferably are substantially spherical, a shape readily deformable to the thickness of the adhesive between particles. Preflattened particles such as those of U.S. Pat. No. 3,514,326 (Stow) can also be used but should be made of softer materials because pre-flattened particles are more resistant to further flattening. When pre-flattened particles are further flattened, there is a hazard of trapping adhesive between the areas particles and the surface against which they are further flattened.

Whether pre-flattened or spherical, the particles preferably are made of a metal such as silver or gold or of laminated metals, one of which preferably is at least as deformable at the bonding temperature of the adhesive as is substantially pure silver at ordinary room temperatures. When a transfer tape of the invention has a heat-activatable adhesive, its particles may be laminates of materials, one of which melts at the activation temperature of the adhesive. Such a laminated particle may have a surface layer that melts and a core that does not melt at the activation temperature of the adhesive, for example, a solder surface layer and either a higher melting metal core such as copper or a nonmetallic core. Another useful laminated particle has a surface layer that does not melt and a core that melts at the activation temperature of the adhesive. The core of such a particle may be a solder, and its surface layer may be a higher melting metal such as silver or copper.

Each of the particles of the novel tape may be an aggregate of tiny fused granules such as granules of a metal which is at least as deformable as substantially pure silver.

Because the heat-activatable adhesive of the novel tape preferably is nontacky at ordinary ambient temperatures, the adhesive layer could be wound directly upon itself for storage and shipment. Since it is necessary to form the adhesive layer on a low-adhesion carrier web, it is convenient to wind the two together for storage and shipment.

A preferred range of thicknesses for the adhesive between particles is from 0.01 to 0.05 mm, and the average particle thickness is preferably between 20 and 80% greater than the adhesive thickness between particles. When the particles have highly uniform thicknesses, excellent results are attained at an average particle diameter only 5% greater than the adhesive thickness between particles.

When the particles comprise 5% by volume of the adhesive layer and their average thickness is one-third greater than the adhesive layer between particles, the average spacing between adjacent particles is about 0.13 mm when the adhesive thickness between particles is 0.02 mm. The average spacing may be as great as about 0.5 mm and preferably is within the range of 0.05 to 0.3 mm in order to insure a good overall electrical and thermal conductivity.

While the novel tape preferably contains electrically and thermally conductive particles, equivalent results can be attained by substituting for the particles other electrically and thermally conductive elements which are as deformable as are the particles under the same conditions to provide small, flat conductive areas at both surfaces of the adhesive layer. For example, the electrically and thermally conductive elements may together form a metal foil, the thickness of which is less than that of the adhesive by itself, but which has at each surface of the layer protuberances that are closely spaced and uniformly distributed throughout the layer. The average distance between apices of the protuberances at one surface to those at the other surface should be greater than, perferably from 10% to 100% greater than, the thickness of the adhesive between protuberances. The protuberances may be provided by embossing the foil as in U.S. Pat. No. 3,497,383 (Olyphant) to form ridges at the surfaces of the adhesive layer that are flattened to provide narrow, elongated flat areas when the adhesive layer is compressed between two flat, rigid plates. Each upstanding portion of metal foil extending between an elongated flat area in one surface and the closest flat area in the other surface provides a metal element that conducts heat and electricity across the adhesive layer. Alternatively, a metal foil may have additional metal fused to its surfaces. For example, drops of silver or of a solder may be fused to a copper foil to provide protuberances, each of which is sufficiently soft to be flattened when the adhesive layer is compressed between two flat, rigid plates.

The metal foil may have uniformly distributed perforations, in which event the adhesive layer of the novel tape may be continuous. When the metal foil is imperforate, the adhesive layer necessarily is separated by the foil into two laminae.

Useful electrically and thermally conductive elements of the novel tape can also be provided by a wire screen of a conductive material which at the bonding temperature of the adhesive preferably is at least as deformable as is substantially pure silver at ordinary room temperature. The pressure applied to such a screen would not only provide small, flat areas on the wires at the surfaces of the adhesive layer but would also flatten the wires at their crossing points, thus enhancing the conductivity of the direct paths between the flattened surface areas.

The novel adhesive transfer tape may be used as a die attach adhesive as follows. First, the tape is adhered by its heat-activated adhesive layer to the back surface of an undiced semiconductor wafer. The wafer is then diced while the carrier web serves the function for which wafer sawing films are currently used. Each resulting die has its own conductive adhesive layer by which it may be bonded to a conductive substrate after removal of the carrier web. If desired, the adhesive-bearing die may be stored indefinitely at room temperature before being adhesively attached to a substrate.

Preferably the novel adhesive tape is used in connection with a conventional wafer sawing film. After bonding the tape by its own heat-activated adhesive tape to a semiconductor wafer and allowing the adhesive to cool, the carrier web is stripped away, and the exposed adhesive layer is adhered to the wafer sawing film by the low-tack adhesive of the wafer sawing film. Then while the wafer sawing film is stretched in a hoop fixture, the wafer and adhesive are diced. Care should be taken in selecting the wafer sawing film that its low-tack adhesive does not contaminate the adhesive of the novel tape.

The adhesive layer of the novel tape may be transferred onto an adhesiveless backing of a wafer sawing film which has a low-adhesion surface. A semiconductor wafer may be bonded by the adhesive layer to the wafer sawing film and sawed into dice, each thus immediately having an electrically and thermally conductive adhesive layer.

BRIEF DESCRIPTION OF THE DRAWINGS

In the drawings

FIG. 1 is a schematic transverse cross-section of a die attach adhesive tape of the invention;

FIG. 2 is a schematic transverse cross-section showing a semiconductor wafer to which the tape of FIG. 1 has been adhered and in turn mounted on a wafer sawing film for dicing; and FIG. 3 shows the use of an adhesive tape similar to that of FIGS. 1 and 2 being used to attach a semiconductor die to a conductive substrate.

DETAILED DESCRIPTION

Figure 4:
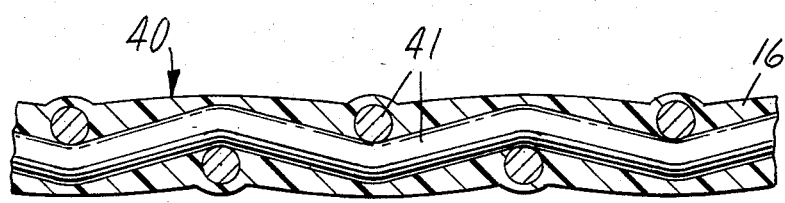
FIG. 4 is a schematic transverse cross-section of another embodiment of the adhesive tape of the invention.

The adhesive tape 10 of FIG. 1 has a flexible carrier web 12 having a low-adhesion surface 14 to which is lightly adhered a layer of adhesive 16 containing spherical electrically and thermally conductive metal particles 18, the diameters of which exceed the thickness of the adhesive 16 between particles.

In FIG. 2, a piece of tape 10 has been adhered by its layer of adhesive 16 to a semiconductor wafer 20 and the carrier web 12 has been stripped off and discarded. The exposed layer of adhesive 16 has been pressed against the low-tack adhesive layer 21 of a conventional wafer sawing film 22 having a carrier web 24. While the wafer sawing film is stretched across a hoop fixture (not shown), the wafer 20 and the adhesive layer 16 are sawed at 26. Because the adhesive bond between the low-tack adhesive layer 21 and the carrier web 24 is stronger than the bond between the two adhesive layers, each die 20a and its adhesive layer 16a can be lifted off the wafer sawing film 22 and adhesively bonded to a conductive substrate to provide a composite similar to that illustrated in FIG. 3.

FIG. 3 shows a die 30 which is bonded to an electrically and thermally conductive substrate 32 by a layer of heat-activated adhesive 34 containing electrically and thermally conductive laminated particles 36. Each of those particles has been flattened by pressing the die 30 against the substrate 32, and that part of the adhesive 34 which had covered the particles has been forced out from between the particles and the substrate 32, thus providing small, flat conductive areas at each surface of the layer of adhesive 34. Each particle 36 has a core 39 and a surface layer 38, one of which may have melted while the other did not melt at the temperature at which the adhesive 34 was activated.

FIG. 4 illustrates another embodiment of the invention wherein adhesive tape 40 is illustrated containing wire screen 41 of a conductive material and adhesive 16.

Figure 5:
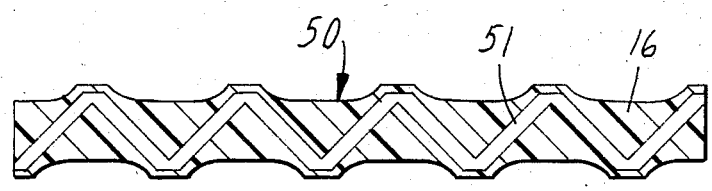
FIG. 5 illustrates another schematic transverse cross-section of yet another embodiment of the adhesive tape of the invention.

FIG. 5 illustrates adhesive tape 50 with embossed foil 51 and adhesive 16.

In the following examples, all parts are given by weight unless otherwise noted.

EXAMPLE 1

An acrylic polymer was made by mixing together 15.5 parts ethyl acrylate, 15.5 parts methyl acrylate, 1.65 parts acrylamide, 0.3 part gamma-methacryloxypropyltrimethoxysilane, 67 parts ethyl acetate and 0.1 part azo-bis-isobutylnitrile ("Vazo" 64 catalyst), purging the mixture with nitrogen to remove oxygen, and heating at 53°–55° C. for 16 hours to give 98–99% conversion to polymer. Weight-averaged $T_g$ of this polymer was 60° C. To this was added 16.5 parts of spherical silver particles which had been sieved, selecting particles which passed through a 400-mesh Tyler sieve (38-micrometer openings) and which were held on a 500-mesh sieve (25-micrometer openings). This combination was then knife-coated onto a film of polytetrafluoroethylene as a low adhesion carrier web and was dried for 5 minutes at 100° C. to a dried thickness of 25 micrometers between the silver particles to provide an adhesive transfer tape of the invention. The thickness of its adhesive layer between particles was about 80% of the average diameter of the particles.

The adhesive layer was transferred to the back surface of a 75-mm diameter silicon wafer by preheating the wafer on a hot plate to 200° C., positioning the adhesive over the wafer and bringing it into full contact with the wafer by means of a rubber roll. After cooling, the adhesive was trimmed around the wafer circumference, and the release liner and excess adhesive were removed. The wafer was then sawed into individual 1.3 mm × 1.3 mm dice after being mounted onto a blue vinyl wafer sawing film (Semiconductor Equipment Corp. Part No. 18074). Individual dice were removed from the wafer sawing film and bonded at 250° C. under a compressive force of 55 newtons to a silver layer on an alumina ceramic substrate. Electrical resistance of the bond between a silicon die and the silver layer was 0.3 ohm as measured by the 4-probe resistance method. The thermal conductivity was 0.017 watts/cm° C. The force required to shear this bond was 46 newtons at ordinary room temperature; 6.7 newtons at 100° C.; and 1.0 newton at 200° C.

EXAMPLE 2

An acrylic polymer having a weight-averaged $T_g$ of 28° C. was selected and prepared as in Example 1 from the following:

|  | Parts |
| --- | --- |
| methyl methacrylate | 6.10 |
| methyl acrylate | 22.00 |
| acrylamide | 1.65 |
| silane | 0.30 |
| "Vazo" 64 catalyst | 0.05 |
| ethyl acetate | 70.00 |

To this was added 9 parts of spherical silver particles which had been sieved, selecting particles which passed through a Tyler sieve of 200-mesh (75-micrometer openings) and were held on 325-mesh (45-micrometer openings) followed by flattening in a 3-roll paint mill to a thickness of approximately 40 micrometers. This was knife-coated onto a silicone-surface biaxially-oriented polyethylene terepthalate film and dried 10 minutes at 80° C. to a thickness of about 20 micrometers between the silver particles. The thickness of the adhesive layer between particles was about one-half the average thickness of the particles.

The adhesive layer of this transfer tape was transferred to the back of a silicon wafer as in Example 1 except at 150° C. After being sawed into individual dice as in Example 1, each die was bonded onto a silver-coated alumina substrate at 180° C. under a compressive force of 67 newtons. The 4-probe bond resistance measurement indicated a bond resistance of 2.4 ohms between the die and the silver coating. The force required to shear this bond was 17 newtons at ordinary room temperature.

EXAMPLE 3

To another portion of the polymer solution of Example 1 was added 8.25 parts spherical silver particles sieved in the same manner as Example 1. This was knife-coated onto a flexible polytetrafluoroethylene film and dried 5 minutes at 100° C. Between particles the dried adhesive layer was 15 micrometers thick or approximately 50% of the average particle diameter. The adhesive layer was transferred at 200° C. to the back of a silicon wafer which was then sawed into 1.3 mm × 1.3 mm dice in the same manner as in Example 1. The resistance between a die and the silver layer of the substrate to which it was bonded at 250° C. was 0.6 ohm measured as in Example 1. The force required to shear the bond was 39 newtons at ordinary room temperature.

EXAMPLE 4

To another portion of the polymer solution of Example 1 was added 16.5 parts of the flattened silver particles used in Example 2. This was knife-coated onto a a polytetrafluoroethylene film carrier web and dried 10 minutes at 100° C. The adhesive thickness between particles was about 40 micrometers or 75% of the average particle thickness. This adhesive was transferred to the back of a silicon wafer which was then sawed into 1.3 mm × 1.3 mm dice in the same manner as in Example 1. When bonded at 250° C. onto a silver-coated alumina substrate, the bond had a resistance of 0.5 ohm and was sheared at a force of 48 newtons at ordinary room temperature.

We claim:

1. Adhesive transfer tape comprising a flexible, low-adhesion carrier web to which is lightly adhered a layer of adhesive containing electrically and thermally conductive particles which at the bonding temperature of the adhesive are at least as deformable as are substantially pure silver spherical particles at ordinary room temperatures, said conductive particles being of uniform thickness at least five percent greater than the thickness of the adhesive between particles, and being uniformly distributed throughout the layer or preselected segments of the layer, and when said particle-containing layer is removed from the carrier web and compressed between two flat rigid plates, the particles are flattened to the thickness of the adhesive between particles, thus providing small, flat conductive areas at both surfaces of the adhesive layer.

2. Adhesive tape as defined in claim 1 wherein the average spacing between adjacent particles is no greater than about 0.5 mm.

3. Adhesive tape as defined in claim 1 wherein the carrier web does not wrinkle when briefly exposed to 200° C.

4. Adhesive tape as defined in claim 1 wherein each of the particles is an aggregate of tiny fused granules.

5. Adhesive tape as defined in claim 1 wherein the particles are substantially spherical.

6. Adhesive tape as defined in claim 5 wherein the particles are silver.

7. Adhesive tape as defined in claim 1 wherein the adhesive layer comprises a polymer of at least one of alkyl acrylate and alkyl methacrylate having a weight-averaged $T_g$ of $-10°$ to 80° C.

8. Adhesive tape as defined in claim 7 wherein said polymer is a copolymer of monomers, up to 50 mol % of which is at least one copolymerizable monomer selected from acrylic acid, methacrylic acid, itaconic acid, maleic acid, maleic anhydride, amides of said acids, and N-vinyl-2-pyrrolidone.

9. Adhesive tape as defined in claim 1 wherein the adhesive is a heat-activatable adhesive and each of the particles is a laminated particle having a surface layer that melts and a core that does not melt at the activation temperature of the adhesive.

10. Adhesive tape as defined in claim 9 wherein the surface layer of each of the particles is a solder.

11. Adhesive tape as defined in claim 9 wherein the core is metal.

12. Adhesive tape as defined in claim 9 wherein the core is nonmetallic.

13. Adhesive tape as defined in claim 1 wherein the adhesive is a heat-activatable adhesive and each of the particles has a surface layer that does not melt and a core that melts at the activation temperature of the adhesive.

14. Adhesive tape as defined in claim 13 wherein the core is a solder.

15. Adhesive tape as defined in claim 14 wherein the surface layer of each of the particles is silver.

16. Method of attaching a die to a thermally and electrically conductive substrate comprising the steps of bonding to a semiconductor wafer the adhesive layer of the tape defined in claim 1, cutting the wafer and adhesive layer into individual adhesive-bearing dice and, at the bonding temperature of the adhesive, pressing the adhesive layer of a die against said substrate under sufficient pressure to flatten the conductive particles of the tape to the thickness of the adhesive layer between particles.

17. Method as defined in claim 16 wherein the adhesive is heat-activatable and is heated to its activation temperature during the compressing.

18. Adhesive tape useful as a die attach adhesive comprising a flexible, low-adhesion carrier web to which is lightly adhered a layer of adhesive containing electrically and thermally conductive elements providing protuberances at each surface of the layer that are closely spaced and uniformly distributed throughout the layer, which protuberances at the bonding temperature of the adhesive are at least as deformable as are substantially pure silver spherical particles at ordinary room temperatures, the average distance between apices of the protuberances at one surface to those at the other surface being from about 10 to about 100 percent greater than the thickness of said adhesive between protuberances.

19. Adhesive tape as defined in claim 18 wherein the elements form a woven wire screen.

20. Adhesive tape as defined in claim 18 wherein the protuberances are provided by embossments of the metal foil.

21. Adhesive tape as defined in claim 18 wherein the elements form a metal foil, the thickness of which is less than half the thickness of the adhesive between protuberances.

22. Adhesive tape as defined in claim 21 wherein the metal foil has knobby protuberances from each of its surfaces.

23. Adhesive tape as defined in claim 22 wherein protuberances from one surface are aligned with protuberances from the other surface and each protuberance is sufficiently soft to be flattened when the adhesive tape is compressed.

24. Adhesive tape as defined in claim 22 wherein the protuberances are provided by drops of solder fused to the metal foil.

* * * * *